(12) United States Patent
Zhang et al.

(10) Patent No.: US 11,714,102 B2
(45) Date of Patent: Aug. 1, 2023

(54) FULLY DIFFERENTIAL ACCELEROMETER

(71) Applicant: Analog Devices, Inc., Wilmington, MA (US)

(72) Inventors: Jianglong Zhang, Vienna, VA (US); Xin Zhang, Acton, MA (US)

(73) Assignee: Analog Devices, Inc., Wilmington, MA (US)

( * ) Notice: Subject to any disclaimer, the term of this patent is extended or adjusted under 35 U.S.C. 154(b) by 0 days.

(21) Appl. No.: 17/342,484

(22) Filed: Jun. 8, 2021

(65) Prior Publication Data

US 2022/0390483 A1    Dec. 8, 2022

(51) Int. Cl.
| | |
|---|---|
| *G01P 15/125* | (2006.01) |
| *G01P 15/18* | (2013.01) |
| *B81B 3/00* | (2006.01) |

(52) U.S. Cl.
CPC .......... *G01P 15/125* (2013.01); *B81B 3/0021* (2013.01); *G01P 15/18* (2013.01); *B81B 2201/0235* (2013.01)

(58) Field of Classification Search
CPC .................................................... G01P 15/125
USPC ........................................................ 73/514.32
See application file for complete search history.

(56) References Cited

U.S. PATENT DOCUMENTS

| | | |
|---|---|---|
| 6,301,965 B1 | 10/2001 | Chu et al. |
| 6,892,575 B2 | 5/2005 | Nasiri et al. |
| 7,043,985 B2 | 5/2006 | Ayazi et al. |
| 7,934,423 B2 | 5/2011 | Nasiri et al. |
| 7,971,483 B2 | 7/2011 | Supino et al. |
| 8,646,308 B2 | 2/2014 | Mueck |
| 8,664,951 B2 | 3/2014 | Johnson et al. |
| 9,242,851 B2 | 1/2016 | Geisberger et al. |
| 9,599,471 B2 | 3/2017 | Vohra et al. |
| 9,606,191 B2 | 3/2017 | Seeger et al. |
| 9,927,459 B2 | 3/2018 | Clark et al. |
| 10,073,113 B2 | 9/2018 | Zhang et al. |
| 10,078,098 B2 | 9/2018 | Zhang |
| 10,167,189 B2 | 1/2019 | Zhang et al. |

(Continued)

FOREIGN PATENT DOCUMENTS

| | | |
|---|---|---|
| CA | 2213245 C | 11/2004 |
| CN | 207066449 U | 3/2018 |

(Continued)

*Primary Examiner* — Walter L Lindsay, Jr.
*Assistant Examiner* — Philip T Fadul
(74) *Attorney, Agent, or Firm* — Wolf, Greenfield & Sacks, P.C.

(57) ABSTRACT

Disclosed herein are aspects of a multiple-mass, multi-axis microelectromechanical systems (MEMS) accelerometer sensor device with a fully differential sensing design that applies differential drive signals to movable proof masses and senses differential motion signals at sense fingers coupled to a substrate. In some embodiments, capacitance signals from different sense fingers are combined together at a sensing signal node disposed on the substrate supporting the proof masses. In some embodiments, a split shield may be provided, with a first shield underneath a proof mass coupled to the same drive signal applied to the proof mass and a second shield electrically isolated from the first shield provided underneath the sense fingers and biased with a constant voltage to provide shielding for the sense fingers.

24 Claims, 11 Drawing Sheets

(56) References Cited

U.S. PATENT DOCUMENTS

| | | |
|---|---|---|
| 10,203,351 B2 | 2/2019 | Zhang |
| 10,203,352 B2 | 2/2019 | Zhang et al. |
| 10,379,137 B2 | 8/2019 | Gafforelli et al. |
| 10,514,259 B2 | 12/2019 | Jia et al. |
| 10,520,526 B2 | 12/2019 | Zhang |
| 10,545,167 B2 | 1/2020 | Zhang et al. |
| 10,585,111 B2 | 3/2020 | Zhang et al. |
| 10,732,198 B2 | 8/2020 | Zhang |
| 10,759,656 B2 | 9/2020 | Painter et al. |
| 10,761,108 B2 | 9/2020 | Zhang |
| 10,816,569 B2 | 10/2020 | Zhang et al. |
| 2002/0189353 A1 | 12/2002 | Knowles et al. |
| 2006/0283246 A1* | 12/2006 | Weinberg ........... G01C 19/5733 73/504.16 |
| 2009/0095079 A1 | 4/2009 | Ayazi |
| 2010/0077858 A1* | 4/2010 | Kawakubo ............. G01P 15/18 73/504.12 |
| 2016/0370180 A1 | 12/2016 | Naumann |
| 2017/0074656 A1 | 3/2017 | Tallur et al. |
| 2017/0108529 A1* | 4/2017 | Zhang .................... G01P 15/18 |
| 2017/0225942 A1 | 8/2017 | Fitzgerald et al. |
| 2019/0212144 A1 | 7/2019 | Thompson |
| 2020/0069890 A1 | 3/2020 | Vigevani et al. |
| 2020/0081029 A1 | 3/2020 | Zhang et al. |
| 2020/0096538 A1 | 3/2020 | Zhang et al. |
| 2020/0132716 A1 | 4/2020 | Zhang |
| 2020/0408801 A1 | 12/2020 | Vohra et al. |

FOREIGN PATENT DOCUMENTS

| | | |
|---|---|---|
| EP | 3 059 595 A1 | 8/2016 |
| EP | 3 139 179 A1 | 3/2017 |
| EP | 3 644 066 A1 | 4/2020 |

* cited by examiner

FULLY DIFFERENTIAL ACCELEROMETER

FIELD OF THE DISCLOSURE

The present application relates generally to an accelerometer, and in particular relates to a microelectromechanical systems (MEMS) accelerometer.

BACKGROUND

A microelectromechanical systems (MEMS) accelerometer may include a movable mass, sometimes also referred to as a proof mass. The proof mass is movable in response to an acceleration of the accelerometer, and the movement of the proof mass may be sensed and processed by circuitry in the accelerometer to generate an output signal representing the acceleration. In a linear MEMS accelerometer, a proof mass is movable along one or more linear axis, and the linear movement of the proof mass may be sensed to indicate linear acceleration along the one or more linear axis.

Some MEMS accelerometers use capacitive sensing to sense movement of a proof mass that is capacitively coupled to electrodes on a semiconductor substrate. When the proof mass moves in response to a sensed acceleration, a magnitude of the capacitive coupling between the proof mass and the electrodes are electrically measured and processed to indicate a magnitude and direction of the sensed linear acceleration.

THE SUMMARY OF THE DISCLOSURE

Disclosed herein are aspects of a multiple-mass, multi-axis microelectromechanical systems (MEMS) accelerometer sensor device with a fully differential sensing design that applies differential drive signals to movable proof masses and senses differential motion signals at sense fingers coupled to a substrate. In some embodiments, capacitance signals from different sense fingers are combined together at a sensing signal node disposed on the substrate supporting the proof masses. In some embodiments, a split shield may be provided, with a first shield underneath a proof mass coupled to the same drive signal applied to the proof mass and a second shield electrically isolated from the first shield provided underneath the sense fingers and biased with a constant voltage to provide shielding for the sense fingers.

According to some embodiments, a differential, multiple-mass, multi-axis accelerometer is provided. The accelerometer comprises first and second proof masses arranged in a substrate side-by-side and in-plane with each other, movable along in-plane X and Y-directions, and configured to have applied thereto a differential drive signal including a first polarity signal applied to the first proof mass and a second polarity signal applied to the second proof mass. The accelerometer further comprises a first plurality of sense fingers coupled to the substrate, capacitively coupled with the first and second proof masses, and configured to sense X-direction movement of the first and second proof masses; and a second plurality of sense fingers coupled to the substrate, capacitively coupled with the first and second proof masses, and configured to sense Y-direction movement of the first and second proof masses. The first plurality of sense fingers are configured in combination to output a differential X-direction motion signal. The second plurality of sense fingers are configured in combination to output a differential Y-direction motion signal.

According to some embodiments, a multi-axis differential accelerometer is provided. The multi-axis differential accelerometer comprises a first movable mass and a second movable mass disposed side-by-side in a substrate and each movable along an X-direction and a Y-direction; a first group of electrodes capacitively coupled with the first movable mass. The multi-axis differential accelerometer further comprises a second group of electrodes capacitively coupled with the second movable mass; an X-sensing signal node disposed on the substrate and coupled to a first subset of the first group of electrodes and a first subset of the second group of electrodes. The X-sensing signal node is configured to provide an X-sensing signal indicative of motion of the accelerometer in the X-direction when the first movable mass and the second movable mass are differentially biased. The multi-axis differential accelerometer further comprises a Y-sensing signal node disposed on the substrate and coupled to a second subset of the first group of electrodes and a second subset of the second group of electrodes. The Y-sensing signal node is configured to provide a Y-sensing signal indicative of motion of the accelerometer in the Y-direction when the first movable mass and the second movable mass are differentially biased.

According to some embodiments, a method for measuring multi-axis acceleration with a multiple-mass, differential accelerometer is provided. The accelerometer comprises first and second proof masses arranged in a substrate side-by-side. The method comprises biasing the first and second proof masses with a differential drive signal; combining, at an X-sensing signal node disposed on the substrate, a first capacitance signal from a first plurality of sense fingers capacitively coupled with the first proof mass with a second capacitance signal from a second plurality of sense fingers capacitively coupled with the second proof mass; combining, at a Y-sensing signal node disposed on the substrate, a third capacitance signal from a third plurality of sense fingers capacitively coupled with the first proof mass with a fourth capacitance signal from a second plurality of sense fingers capacitively coupled with the second proof mass; outputting a differential X-direction motion signal based on a signal at the X-sensing signal node; and outputting a differential Y-direction motion signal based on a signal at the Y-sensing signal node.

BRIEF DESCRIPTION OF THE DRAWINGS

Various aspects and embodiments of the application will be described with reference to the following figures. It should be appreciated that the figures are not necessarily drawn to scale. Items appearing in multiple figures are indicated by the same reference number in all the figures in which they appear. In the drawings.

DETAILED DESCRIPTION

Figure 1A:
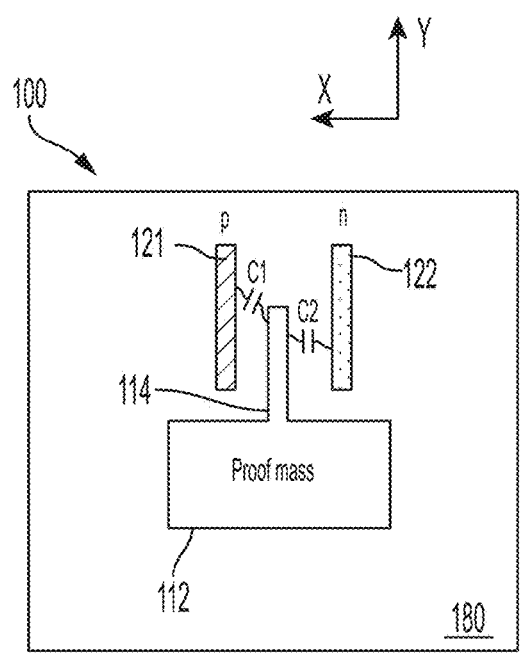
FIG. 1A is a schematic top view diagram of an accelerometer having a single proof mass.

Aspects of the present application provide a differential, multiple-mass, multi-axis microelectromechanical systems (MEMS) accelerometer with a fully differential sensing design that applies differential drive signals to movable proof masses and senses differential motion signals at sense fingers coupled to a substrate.

Some aspects are directed to fully differential sensing of linear acceleration using multiple proof masses. In some embodiments, two proof masses are provided to differentially sense acceleration in an X-direction. Each proof mass is biased with a differential drive signal. A first capacitance signal from sense fingers capacitively coupled with the first proof mass and a second capacitance signal from sense fingers capacitively coupled with the second proof mass are combined such as to output a differential motion signal in the X-direction. The inventors have recognized and appreciated that by combining signals from sense fingers adjacent two differentially biased movable proof masses to generate a differential motion signal representing the X-direction acceleration, undesirable common mode signals may be attenuated or entirely cancelled out prior the output motion signal is processed by sensing circuitry within the accelerometer. Such a differential sensing design can provide several benefits, such as reducing sensing cross-talks within the accelerometer, simplifying the sensing circuitry design using application-specific integrated circuit (ASIC), reducing the charging overload to the sensing circuitry and reducing the complexity of over range detection in the sensing circuitry.

In some embodiments, the first and second capacitance signals from different sense fingers are combined together at a sensing signal node disposed on the substrate supporting the proof masses. The sensing signal node may be further connected to sensing circuitry such as a differential amplifier to further process the combined capacitance signals. By combining the capacitance signals on the substrate, the complexity of the sensing circuitry design may be reduced and the system noise performance may be improved.

In one aspect, the inventors have recognized and appreciated that because of the relatively large surface area of a proof mass facing the substrate underneath, applying a time-varying drive signal to the proof mass would lead to a sizeable capacitive coupling between the proof mass and the substrate that may undesirably interfere with the in-plane motion of the proof mass responsive to the input acceleration and create crosstalk in sensed electronic signals. Further, the proof mass-substrate interaction cannot be mitigated with a constant voltage shield on the substrate, due to the time-varying nature of the drive signal on the proof mass. As a solution, a split shield may be provided on the substrate underneath the proof masses and the sense fingers such that separate shielding voltage may be applied to the proof masses and the sense fingers, respectively. In some embodiments, a first shield underneath a proof mass is coupled to the same drive signal applied to the proof mass to reduce electrostatic interactions between the substrate and the proof mass. A second shield electrically isolated from the first shield is provided underneath the sense fingers and is biased with a constant voltage to provide shielding for the sense fingers.

Another aspect is directed to differential sensing of multi-axis accelerations along multiple directions. In some embodiments, each of the two proof masses used for differential sensing is movable along more than one direction, such as both X- and Y-directions, or three axis including X-, Y- and Z-directions. Because drive signals are applied to the proof masses, a single set of drive signals can be used for sensing of acceleration along multiple directions, which may simplify the clock signal generation and reduce cross talk between multiple different clock signals.

Figure 1B:
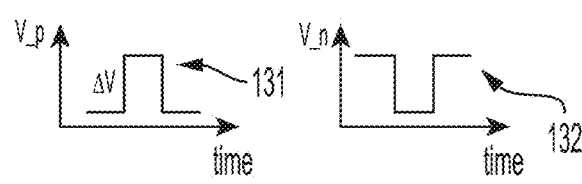
FIG. 1B shows two timing diagrams illustrating an example of forward charge sensing of the accelerometer shown in FIG. 1A.
Figure 1C:
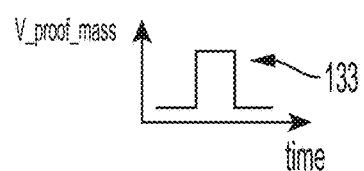
FIG. 1C shows a timing diagram illustrating an example of reverse charge sensing of the accelerometer shown in FIG. 1A.

FIG. 1A is a schematic top view diagram of an accelerometer having a single proof mass. FIGS. 1B and 1C are schematic timing diagrams that illustrate forward sensing and reverse sensing schemes that can be used for sensing motion of the proof mass in FIG. 1A.

FIG. 1A illustrates an accelerometer 100 having a proof mass 112 and sense fingers 121, 122 disposed on a substrate 180. The proof mass 112 may be movable along one or more directions relative to the substrate 180. As shown in FIG. 1A, proof mass 112 may be suspended above the substrate 180 and is movable along the X-Y plane parallel to a top surface of substrate 180.

While not shown, accelerometer 100 includes one or more tethers that mechanically connect proof mass 112 to substrate 180 and permit the proof mass 112 to move while providing a restoring force when the proof mass is displaced from its equilibrium. One end of a tether is connected to the movable proof mass, and the other end of the tether is connected to the substrate. Also, the space between sense fingers 121 and the movable proof mass 112 may comprise air or an inert gas to permit free relative motion between the sense fingers and the proof mass. In some embodiments, the accelerometer may comprise a cavity (not shown) formed on the substrate 180, and the proof mass 112 is disposed within the cavity. Any suitable pressure or gas composition may be provided in the cavity, such as but not limited to an inert gas environment. The cavity may be hermetically sealed from ambient environments, such that the environmental effects such as moisture, oxidation, pressure change are kept from components inside the cavity.

Proof mass 112 may be shaped as a plate, one or more beams, or of any suitable size, shape. Proof mass 112 may comprise a conductive material such as semiconductor, metal, metal alloy, carbon allotropes, conductive ceramics, or any suitable material or combination thereof. In some embodiments, proof mass 112 comprises one or more connection points such as conductive traces or pads that are coupled to voltage signals to bias the conductive material within proof mass 112 at any suitable electrical potential.

As shown in FIG. 1A, in some embodiments the proof mass 112 may be rectangular, and may have protrusions such as finger 114 that are shaped and positioned to provide capacitive coupling with adjacent sense fingers 121, 122. In some embodiments, the proof mass 112 is a resonator.

The X-direction motion of proof mass 112 may be capacitively sensed based on changes in capacitive couplings between proof mass 112 and the sense fingers 121, 122. As shown in FIG. 1A, sense finger 121 forms a variable capacitance C1 with a finger 114 of the proof mass 112, while sense finger 122 forms a variable capacitance C2 with finger 114 of the proof mass 112. When the proof mass 112 moves in the positive X-direction, or towards the left in FIG. 1A, C1 increases due to the reduction of horizontal distance between sense finger 121 and the proof mass 112. Sense finger 121 may be referred to as a p-finger for the purpose of discussing sense fingers for sensing X-direction motion. Meanwhile, C2 decreases when the proof mass moves towards the left due to the increase of horizontal distance between sense finger 122 and the proof mass 112. Sense finger 122 may be referred to as an n-finger.

Sense fingers 121, 122 are disposed on substrate 180, and may be electrodes that are formed of any suitable conductive material such as semiconductor, metal, metal alloy, carbon allotropes, conductive ceramics, or any suitable material or combination thereof. It should be appreciated that FIG. 1A only shows a pair of sense fingers for simplicity, and an embodiment of the present application may have a plurality of sense fingers that for sensing X-direction movement of a proof mass, of which a first subset of sense fingers including sense finger 121 are p-fingers, and a second subset of sense fingers including sense finger 122 are n-fingers. Proof mass 112 may also have a plurality of fingers 114 arranged along the X-direction in an inter-digited or comb configuration between pairs of p- and n-fingers. Sense fingers may be of any suitable size or shape, and not limited to elongated rectangles as shown in the example in FIG. 1A. In some embodiments, sense fingers are fixedly attached to the substrate 180, although it is not a requirement that sense fingers are fixed.

The X-direction motion of proof mass 112 may be sensed capacitively based on a change in the amount of charges Q stored on a capacitor plate of C1 and C2 in response to motion. FIG. 1B shows two timing diagrams illustrating an example of forward charge sensing of the accelerometer shown in FIG. 1A. In forward sensing, the proof mass is at a constant voltage potential and used to sense an output signal, while the sense fingers are driven with time-varying drive signals. As shown in FIG. 1B, the p-fingers and n-fingers are driven with opposite-polarity clock signals or differential drive signals V_p 131, V_n 132, respectively, while an output signal is generated at the proof mass 112 which may be fixed at a constant voltage potential. As the amount of charge stored on a capacitor plate is $Q=V \cdot C$, where V is the voltage across the two plates in a capacitor, and C is the capacitance value of the capacitive coupling, change in the amount of charge stored on C1 may be represented as $Q=\Delta V \cdot \Delta C$, where $\Delta V$ is the voltage difference between the high potential and low potential of the applied clock signals 131, 132, $\Delta C$ is the change in capacitive coupling during movement. In FIG. 1A, the output signal at proof mass 112 is the sum of change in the amount of charges in both C1 and C2, due to the opposite polarity in biases on p- and n-fingers. The change in the amount of charge Q at a capacitor plate may be a capacitance signal that is representative of the motion-induced change in a capacitive coupling.

FIG. 1C shows a timing diagram illustrating an example of reverse charge sensing of the accelerometer shown in FIG. 1A. In reverse sensing, a drive signal V_proof_mass 133 is applied to the proof mass 112, and a pair of differential output signals are sensed at sense fingers 121, 122, and combined differentially to indicate the change of charges Q on the capacitors C1 and C2.

Figure 2A:
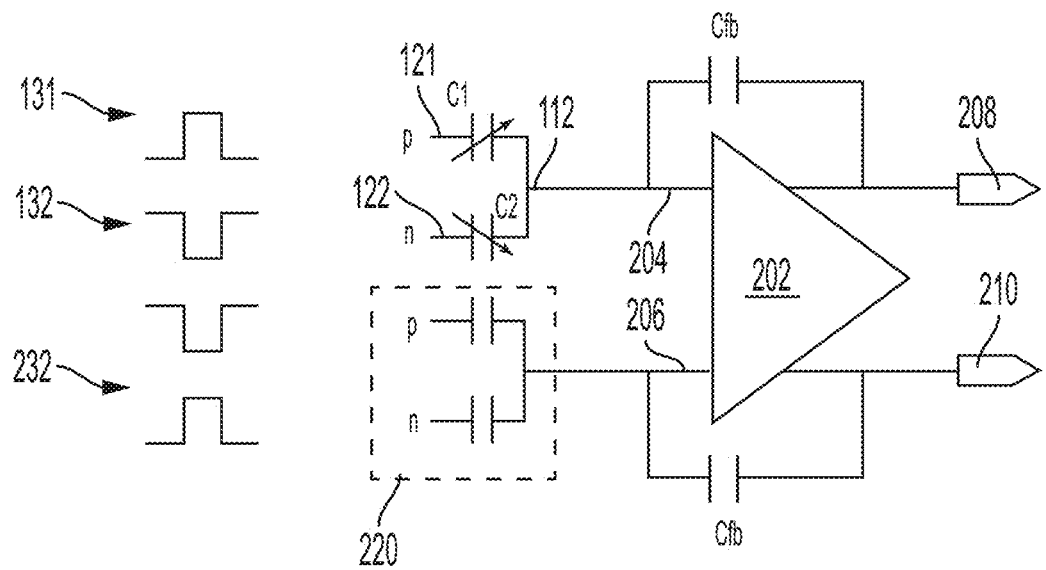
FIG. 2A is a schematic circuit diagram of a sensing circuitry that can be used with the forward sensing scheme illustrated in FIGS. 1A and 1B.
Figure 2B:
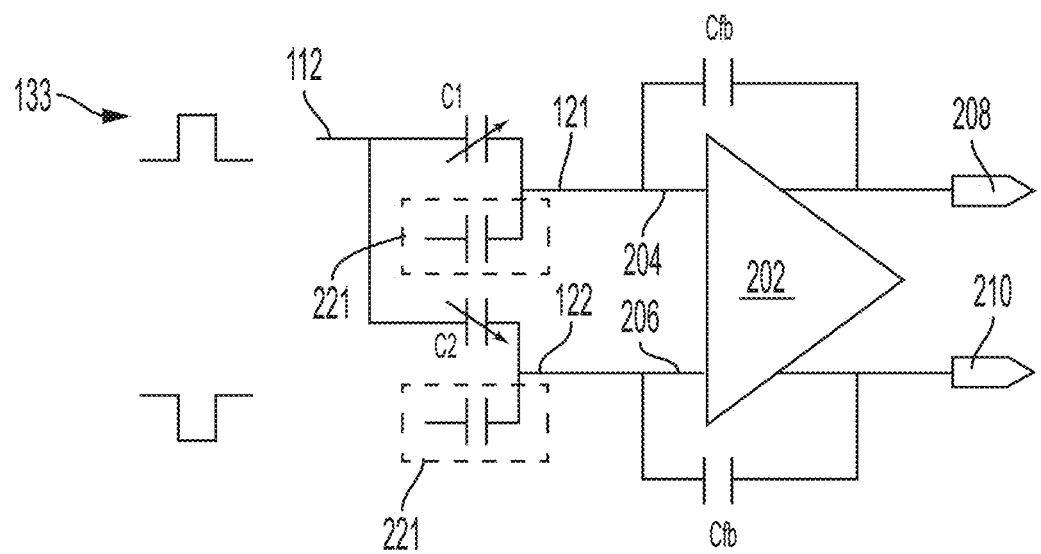
FIG. 2B is a schematic circuit diagram of a sensing circuitry that can be used with the reverse sensing scheme illustrated in FIGS. 1A and 1C.

The inventors have recognized and appreciated that with a single proof mass, neither forward sensing nor reverse sensing in FIGS. 1B and 1C can eliminate undesirable common mode signals unrelated to motion of the proof mass. Techniques such as using a compensation circuit may be used to compensate for common mode signals, such techniques add to the complexity of the sensing circuitry. FIGS. 2A and 2B illustrate two examples of using a compensation circuit in combination with the forward and reverse sensing schemes of FIGS. 1B and 1C, respectively.

FIG. 2A is a schematic circuit diagram of a sensing circuitry that can be used with the forward sensing scheme illustrated in FIGS. 1A and 1B. In FIG. 2A, the motion-induced change in charge Q from C1 and C2 are sensed from the proof mass 112, which is connected to a first input terminal 204 of a differential amplifier 202. Differential drive signals 131, 132 are applied to the p- n-fingers 121, 122, respectively. FIG. 2A shows a compensation circuitry 220 provided to a second input terminal 206 of the differential amplifier 202. Compensation circuitry 220 may comprise capacitors formed of structures disposed on the substrate 180 in the accelerometer that are driven by drive signals 232. Compensation circuitry 220 may alternatively or additionally comprise components formed in an ASIC.

Because compensation circuitry 220 is not sensitive to motion of the proof mass, the signal at the second amplifier input 206 may be used by the differential amplifier to compensate for common mode signals, for example by comparing output signals at differential amplifier outputs 208 and 210 with each other. Compensation circuitry 220, amplifier 202 and feedback capacitors Cfb may be implemented in any suitable ways, for example as part of an ASIC within the accelerometer. The ASIC may be provided on a separate substrate from a MEMS substrate such as substrate 180 having the proof mass and sense fingers, and in some embodiments the ASIC and MEMS substrate may be bonded in one package to reduce device footprint and improve electrical performance such as reducing noise.

FIG. 2B is a schematic circuit diagram of a sensing circuitry that can be used with the reverse sensing scheme illustrated in FIGS. 1A and 1C. In FIG. 2B, proof mass 112 is driven by drive signal 133, while the motion-induced change in charge Q from C1 and C2 are sensed from the two sense fingers 121 and 122. The p-finger 121 is connected to the first input terminal 204 of differential amplifier 202, while the n-finger 122 is connected to the second input terminal 206 of differential amplifier 202. To compensate for common mode signal, compensation circuitry 221 are provided, which may be implemented in any number of suitable ways, such as in an ASIC. In some embodiments, a dummy capacitor is provided in compensation circuitry 221. The dummy capacitor may be a dummy beam node in the ASIC.

Some embodiments of the present application provide two proof masses in a fully differential reverse sensing configuration, namely with drive signals applied to the two proof masses, such that the compensation circuitry as shown in FIGS. 2A and 2B can be eliminated.

Figure 3:
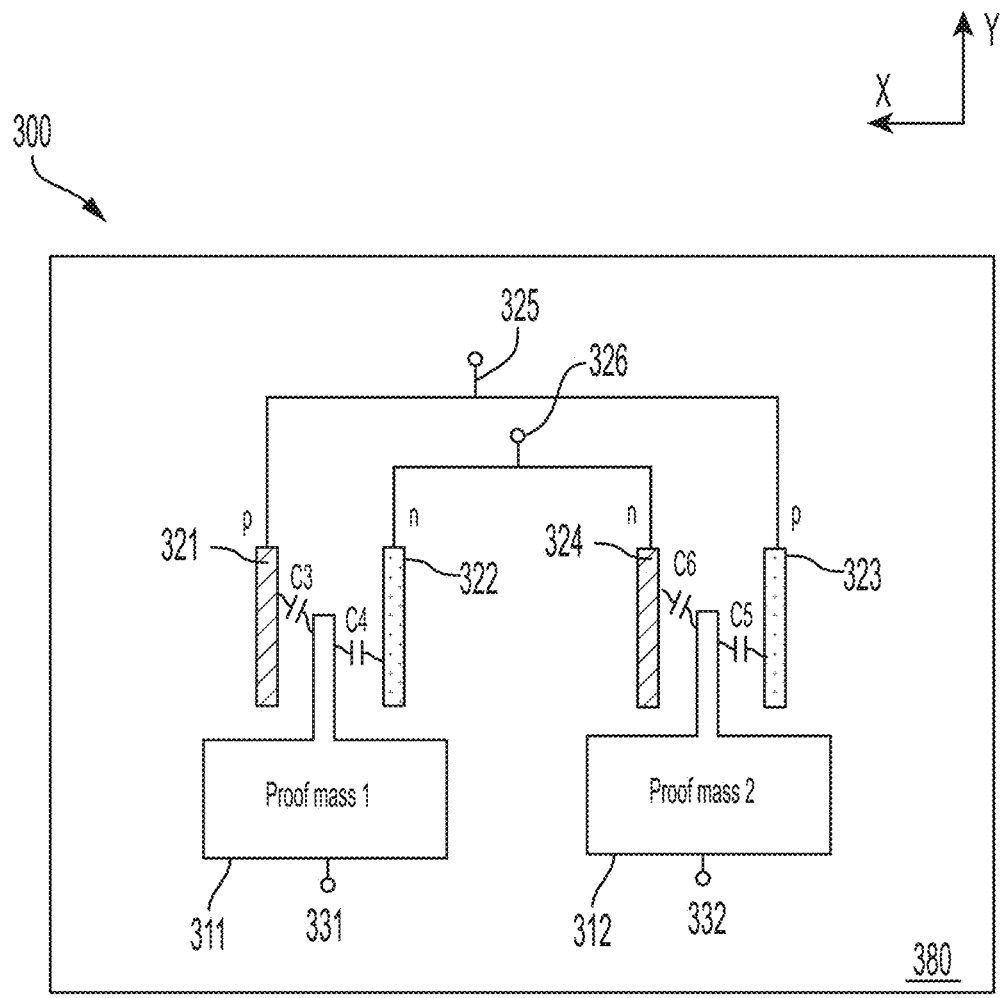
FIG. 3 is a schematic top view diagram of a differential, multiple-mass accelerometer, in accordance with some embodiments.

FIG. 3 is a schematic top view diagram of a differential, multiple-mass accelerometer, in accordance with some embodiments. FIG. 3 shows an accelerometer 300 that includes a substrate 380, first proof mass 311 and second proof mass 312 that are side-by-side and in-plane with each other above the substrate 380, and sense fingers 321, 322, 323 and 324 coupled to the substrate 380. The manner that the proof masses and the sense fingers in FIG. 3 may be implemented is similar in many aspects to the proof mass and sense fingers as shown in FIG. 1A as described above. Optionally and additionally, the accelerometer 300 may comprise a sealed cavity (not shown) on the substrate 380, and the sense fingers and the proof masses are disposed within the sealed cavity.

In FIG. 3, sense finger 321 forms a capacitive coupling C3 with the first proof mass 311 that increases as first proof mass 311 moves along the positive X-direction. Sense finger 322 forms a capacitive coupling C4 with the first proof mass 311 that decreases as proof mass 311 moves along the positive X-direction. Sense finger 323 forms a capacitive coupling C5 with the second proof mass 312 that decreases as second proof mass 312 moves along the positive X-direction. Sense finger 324 forms a capacitive coupling C6 with the second proof mass 312 that increases as second proof mass 312 moves along the positive X-direction. It should be appreciated that FIG. 3 is only a simplified example and there may be a plurality of sense fingers capacitively coupled with the first and second proof masses. Similarly, each of the capacitances C3, C4, C5, C6 may represent an effective or aggregate capacitance of a subset of such plurality of sense fingers that are capacitively coupled to respective proof masses.

In accelerometer 300, each proof masses 311, 312 are driven by a pair of differential drive signals 331, 332. Sensing is performed at the sense fingers. In particular, signals from the sense fingers 321 and 323 are combined together to provide a first X-sensing signal at a signal node 325. Meanwhile, signals from the sense fingers 322 and 324 are combined together to provide a second X-sensing signal at a signal node 326. In some embodiments, proof masses 311, 312 may be mechanically coupled through a suitable linkage, but nevertheless electrically isolated from each other to allow different drive signals to be applied to each proof mass.

Figure 4:
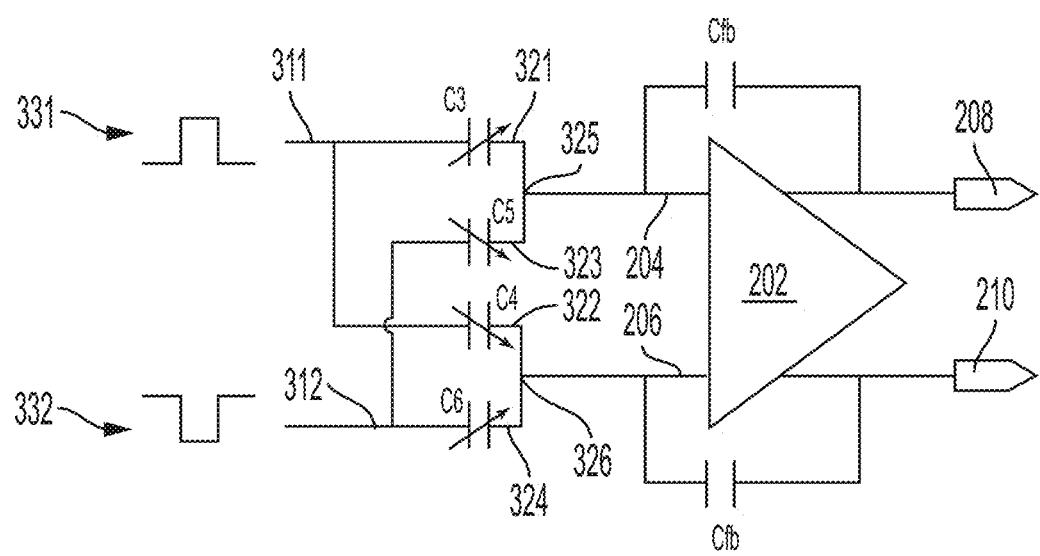
FIG. 4 is a schematic circuit diagram of a sensing circuitry that can be used to operate the differential, multiple-mass accelerometer shown in FIG. 3.

FIG. 4 is a schematic circuit diagram of a sensing circuitry that can be used to operate the differential, multiple-mass accelerometer shown in FIG. 3. FIG. 4 shows that opposite polarity clock signals 331, 332 are applied to the first and second proof masses 311, 312, respectively. The clock signals 331, 332 have the same timing and are differential representations of the same drive signal. To sense X-direction motion of the two proof masses, a first subset of sense fingers 321 that form C3 with the first proof mass and a second subset of sense fingers 323 that form C5 with the second proof mass are connected to a first signal node 325 coupled to the first input 204 of differential amplifier 202. Therefore a first capacitance signal from sense finger 321 is combined with a second capacitance signal from sense finger 323 are combined at signal node 325. Differential amplifier 202 outputs a first differential X-direction motion signal at a first output terminal 208 by amplifying the combined signal at signal node 325, although it should be appreciated that other suitable circuitry and signal processing may be performed to generate an output motion signal in place of or in addition to the use of an amplifier 202.

As explained below, the fully differential reverse sensing configuration shown in FIG. 3 is able to increase amplitude of the motion-related charge signals, while canceling out non-motion related noise or background signal. As an illustrative example, when the proof masses 311, 312 move along the same X-direction, capacitive coupling C3 increases, while capacitive coupling C5 decreases, thus motion-related changes in respective capacitances $\Delta C$ for sense fingers 321, 323 always have opposite polarities Meanwhile, the proof masses 311, 312 are differentially clocked, such that the voltage $\Delta V_1$ for sense finger 321, and the voltage $\Delta V_2$ for sense finger 323 always have opposite polarities. Because of such double-negatives in the polarities of $\Delta C$ and $\Delta V$, the motion-related charge signals $Q=\Delta V \cdot \Delta C$ on sense finger 321, 323 have the same polarity and both contribute accumulatively to the magnitude of a first X-sensing signal at signal node 325. Meanwhile, non-motion related signals such as noise or other background signal have opposite polarity at sense fingers 321 and 323 due to the differential biasing of the proof masses, and are canceled out when the signals are combined at a single signal node 325. As a result, differential sensing can be achieved without using dummy capacitors or otherwise a compensation circuit as shown in the reverse sensing scheme in FIG. 2B.

Referring back to FIG. 3, which shows signal node 325 disposed on substrate 380. In the embodiment shown, signal node 325 may be connected to sense fingers 321, 323 in any suitable manner, such as using a conductive structure disposed on substrate 380. Capacitance signals from sense fingers 321 and 323 are combined at signal node 325 before connecting to differential amplifier 202. By combining the capacitance signals from different sense fingers to a signal node disposed on the substrate, the complexity of the sensing circuitry design may be reduced and the system noise performance may be improved.

Turning back to FIG. 4, which also illustrates a further differential sensing of capacitance signals at sense fingers 322, 324, which are combined at a signal node 326 that is coupled to the second input terminal 206 of differential amplifier 202. Differential amplifier 202 may output a second differential X-direction motion signal at the second output terminal 210 that is based on the combination of capacitance signals at sense fingers 322 and 326. Optionally, the first differential X-direction motion signal at output 208 and the second differential X-direction motion signal at output 210 may be further combined to cancel out common mode signals in the sensing circuitry.

Figure 5:
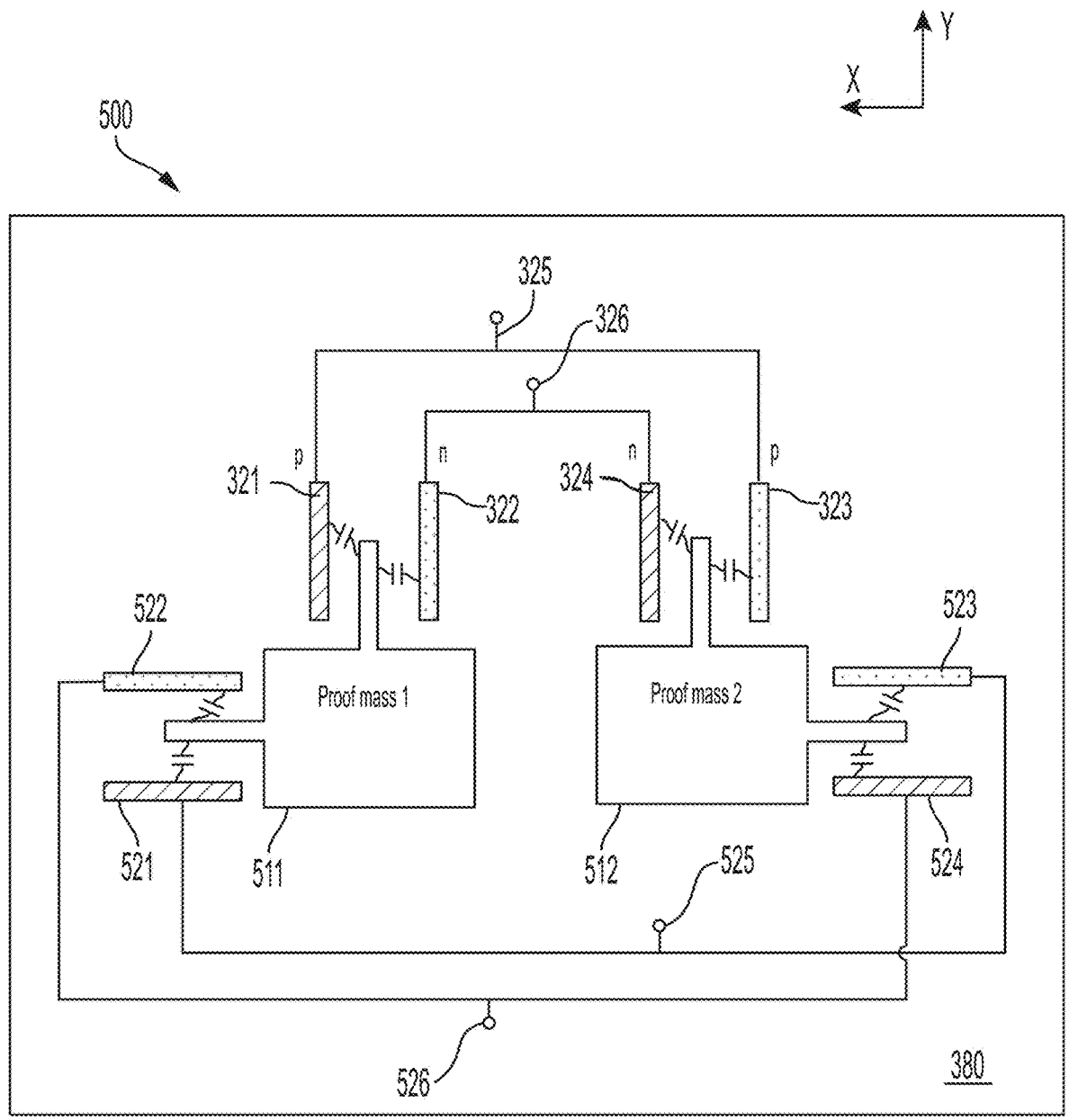
FIG. 5 is a schematic top view diagram of a multiple-mass accelerometer with X- and Y-axis differential sensing, in accordance with some embodiments.

Some aspects are directed to multi-axis differential sensing using two proof masses. FIG. 5 is a schematic top view diagram of a multiple-mass accelerometer with X- and Y-axis differential sensing, in accordance with some embodiments. FIG. 5 shows an accelerometer 500 that includes proof masses 511 and 512 that are each movable in an XY plane along an X-direction and an Y-direction. Accelerometer 500 is similar in some respects to accelerometer 300 shown in FIG. 3, with like components labeled with the same reference numbers. Accelerometer 500 has a first group of sense fingers 321, 322, 324, 323 capacitively coupled with the first and second proof masses 511, 512 to sense X-direction movement, and a second group of sense fingers 521, 522, 523, 524 capacitively coupled with the first and second proof masses to sense Y-direction movement.

To sense X-direction motion, a pair of differential drive signals 331, 332 are applied to the first and second proof masses 511, 512 as shown in FIG. 4. In FIG. 5, sense finger 321 is part of a first subset within the first group of sense fingers that forms an increasing capacitance with the first proof mass 511 when the first proof mass moves in a positive X-direction, while sense finger 323 is part of a second subset within the first group of sense fingers that forms a decreasing capacitance with the second proof mass 512 when the second proof mass moves in a positive X-direction. Capacitance signals at sense finger 321 and at sense finger 323 are combined at a signal node 325, and the combined signal may be used to generate a differential X-direction motion signal, for example by using a differential amplifier similar to those described above in relation with FIG. 4.

Still referring to FIG. 5, the same differential drive signals applied to the proof masses also enable sensing in their Y-direction movement. As shown, sense finger 522 is part of a first subset within the second group of sense fingers that forms an increasing capacitance with the first proof mass 511 when the first proof mass moves in a positive Y-direction, while sense finger 524 is part of a second subset within the second group of sense fingers that forms a decreasing capacitance with the second proof mass 512 when the second proof mass moves in a positive Y-direction. Capacitance signals at sense finger 522 and at sense finger 524 are combined at a signal node 526, and the combined signal may be used to generate a first differential Y-direction motion signal, for example by using a differential amplifier as described above in relation with FIG. 4. Furthermore, capacitance signals at sense finger 521 and sense finger 523 may also be combined at a signal node 525 and further processed to generate a second differential Y-direction motion signal. The first and second differential Y-direction motion signal may be further combined to cancel out common mode signals.

The differential, multi-axis, multiple-mass accelerometers as described herein have several advantages over alternative sensing schemes. For example, embodiments of the present application provide better noise performance. The inventors have appreciated and recognized that noise in the sensed capacitance signal may arise from parasitic coupling between a component and the substrate, which varies proportionally to the projected area of the component with the substrate. In some embodiments, the proof mass has a larger projected area on the substrate compared to the projected area of the sense fingers. As a result, by driving the proof mass and sensing at the sense fingers, less noise is picked up due to parasitic coupling. As an added benefit, a proof mass with a large surface area and a large mass may be used with little or no impact on the parasitic noise in the sensed signal, which provides additional design flexibility to the accelerometer.

As another advantage, better offset performance may be provided by embodiments using fully differential signal path to reject common mode effects, as offset effects such as drift may be compensated by the fully differential sensing. Additionally, because no compensation circuitry is required on the ASIC to implement the fully differential sensing, ASIC circuit design may be simplified.

Furthermore, because the drive signals are applied to the proof masses that move in both X- and Y-directions, a single set of drive signals such as a clock signal may be used, which simplifies the requirement for clock signal generation and reduces the risk of cross talk between multiple clock signals.

While the previous examples are directed to embodiments having proof masses movable along X- and Y-directions, it should be appreciated that aspects of the present application are applicable directions that are not necessarily orthogonal, and directions that are not in plane with the substrate. In some embodiments, the proof masses are additionally movable along a Z-direction that is outside the XY plane and configured to provide differential reverse sensing of acceleration in the Z-direction.

Figure 6A:
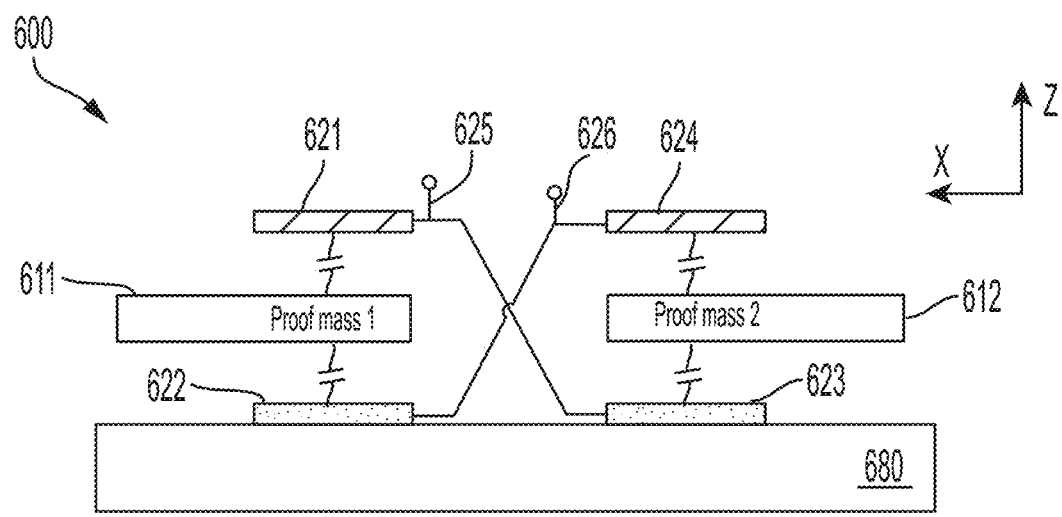
FIG. 6A is a schematic side view diagram of a multi-axis differential accelerometer that can provide Z-direction acceleration sensing, in accordance with some embodiments.

FIG. 6A is a schematic side view diagram of a multi-axis differential accelerometer that can provide Z-direction acceleration sensing, in accordance with some embodiments. FIG. 6A shows an accelerometer 600 that includes a substrate 680, first proof mass 611 and second proof mass 612 that are side-by-side and in-plane with each other above the substrate 680, and sense electrodes 621, 622, 623, 624.

Proof masses 611 and 612 are each movable along the X-, Y- and Z-directions, and in some embodiments are each capacitively coupled to sense fingers (not shown) that can sense X- and Y-direction capacitance signals responsive to their motions in the XY plane in similar ways as shown in FIGS. 3 and 5 and relevant discussions above. The proof masses 611, 612 are differentially biased with a pair of differential drive signal for X- and Y-direction sensing at the sense fingers, while the same drive signals are also driving capacitive sensing in the Z-direction.

For sensing motion in the Z-direction, sense electrode 621 forms a capacitance with the first proof mass 611 that increases as first proof mass 611 moves along the positive Z-direction. Sense electrode 622 forms a capacitance with the first proof mass 611 that decreases as proof mass 611 moves along the positive Z-direction. Sense electrode 623 forms a capacitance with the second proof mass 612 that decreases as second proof mass 612 moves along the positive Z-direction. Sense electrode 624 forms a capacitance with the second proof mass 612 that increases as second proof mass 612 moves along the positive Z-direction.

In FIG. 6A, sense electrode 621 and sense electrode 623 are both coupled to a Z-sensing signal node 625, and capacitance signals at sense electrodes 621, 623 may be combined at signal node 625 to generate a Z-sensing signal indicative of motion of the accelerometer 600 in the Z-direction. Sense electrode 622 and sense electrode 624 are both coupled to a Z-sensing signal node 626. Either or both Z-sensing signal node 625, 626 may be disposed on the substrate 680.

It should be appreciated that a translational Z-sensing configuration between the four sense electrodes and the two proof masses are shown in FIG. 6A, such a configuration is for purpose of illustrative example only and aspects of the present application are not so limited. In some embodiments, each sense electrode is one of a subset of a plurality of sense electrodes that are capacitively coupled to a proof mass to sense motion in the Z-direction. The sense electrodes may be formed of a conductive material of any suitable size or shape.

It should also be appreciated that FIG. 6A is only a high-level diagram to illustrates the capacitive coupling relations between sense electrodes and proof masses and the spatial relations illustrated between components are not to scale and are not limiting. In embodiments for the present application, sense electrodes 621, 622, 623, 624 for Z-direction sensing may be disposed in any spatial relationship with respect to a corresponding proof mass, and there is no requirement for proof mass 611 to be disposed between sense electrodes 621, 622 as shown in FIG. 6A. Any suitable placement of a sense electrode may be used to provide a capacitive coupling with a proof mass that varies either positively or negatively with the Z-direction motion of the proof mass. For example, sense electrodes 621, 622 may both be disposed on a surface of substrate 680, each facing a proof mass 611. In some embodiments, Z-sensing may be provided by the proof masses using a tilt-mode configuration, as discussed below in relation to FIG. 6B.

Figure 6B:
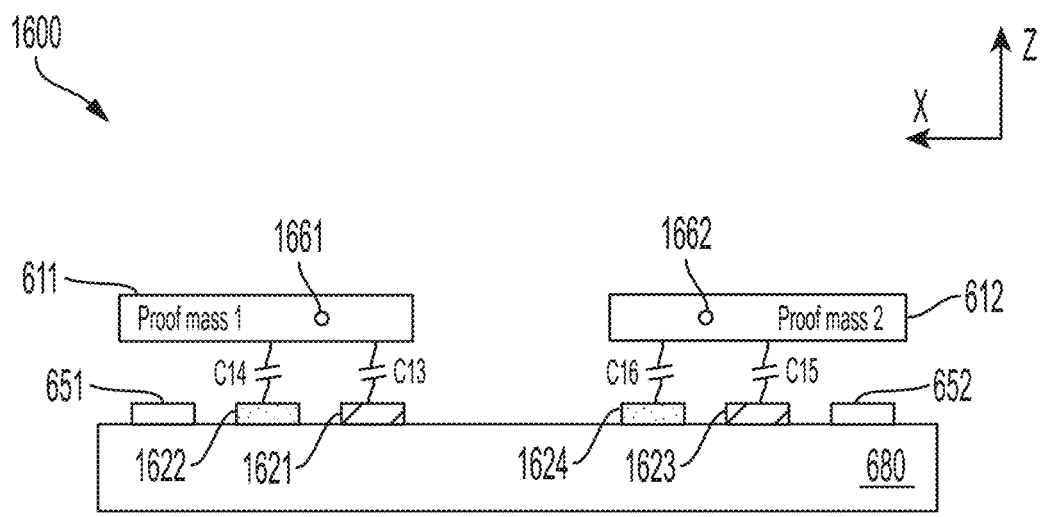
FIG. 6B is a schematic side view diagram of a multi-axis differential accelerometer with tilt-mode Z-direction acceleration sensing, in accordance with some embodiments.

FIG. 6B is a schematic side view diagram of a multi-axis differential accelerometer with tilt-mode Z-direction acceleration sensing, in accordance with some embodiments. FIG. 6B shows an accelerometer 1600 that includes a substrate 680, first proof mass 611 and second proof mass 612 that are side-by-side and in-plane with each other above the substrate 680, and sense electrodes 1621, 1622, 1623, 1624.

In FIG. 6B, first proof mass 611 and second proof mass 612 may also be referred to as a pivotable beam, a teeter-totter, or by other similar terminology. Each of first proof mass 611 and second proof mass 612 is configured to pivot about a respective axis of rotation, or pivot point 1661, 1662. Sense electrodes 1621, 1622, 1623, 1624 are disposed on the substrate 680 underlying the proof masses 611, 622. In this manner, each proof mass may form capacitances with the sense electrodes underneath. Each proof mass is asymmetric along the X-direction about respective pivot point 1661, 1662 in at least some embodiments, to facilitate rotation in response to acceleration in the Z-direction. Optionally, an anchor (not shown) may be coupled to the proof mass 611 at the pivot point 1661, although alternative manners of connecting the proof mass 611 to the substrate 680 are possible. An example of a proof mass with a tilt mode Z-axis sensing configuration is described in U.S. Pat. No. 10,816,569, issued on Oct. 27, 2020 and entitled "Z AXIS ACCELEROMETER USING VARIABLE VERTICAL GAPS," the disclosure of which is hereby incorporated by reference in its entirety.

Accelerometer 1600 may provide differential sensing of motion in the Z-direction in a similar configuration as accelerometer 600. Briefly, in FIG. 6B the proof masses 611, 612 are differentially biased with a pair of differential drive signals. Sense electrode 1621 forms a capacitance C13 with the first proof mass 611 that increases as first proof mass 611 pivots clockwise about pivot point 1661 in response to a Z-motion of the accelerometer 1600, while sense electrode 1622 forms a capacitance C14 with the first proof mass 611 that decreases. In the meantime, sense electrode 1623 forms a capacitance C15 with the second proof mass 612 that decreases as second proof mass 612 pivots counter-clockwise about pivot point 1662 in response to the same Z-motion, while sense electrode 1624 forms a capacitance C16 with the second proof mass 612 that increases. In some embodiments, sense electrode 1621 and sense electrode 1623 are both coupled to a Z-sensing signal node 625 as shown in FIG. 6A, and capacitance signals at sense electrodes 1621, 1623 may be combined at signal node 625 to generate a Z-sensing signal indicative of motion of the accelerometer 1600 in the Z-direction. In the same embodiments, sense electrode 1622 and sense electrode 1624 are both coupled to a Z-sensing signal node 626 as shown in FIG. 6A.

Optionally and additionally, shields 651, 652 are provided on substrate 680 underneath respective proof masses 611 and 612, according to some embodiments. Shields 651, 652 may each be biased with the same bias voltage applied to respective proof masses 611 and 612 to electrostatically shield the proof masses from the substrate 680. The aspects of shielding are discussed in more detail below.

Figure 7:
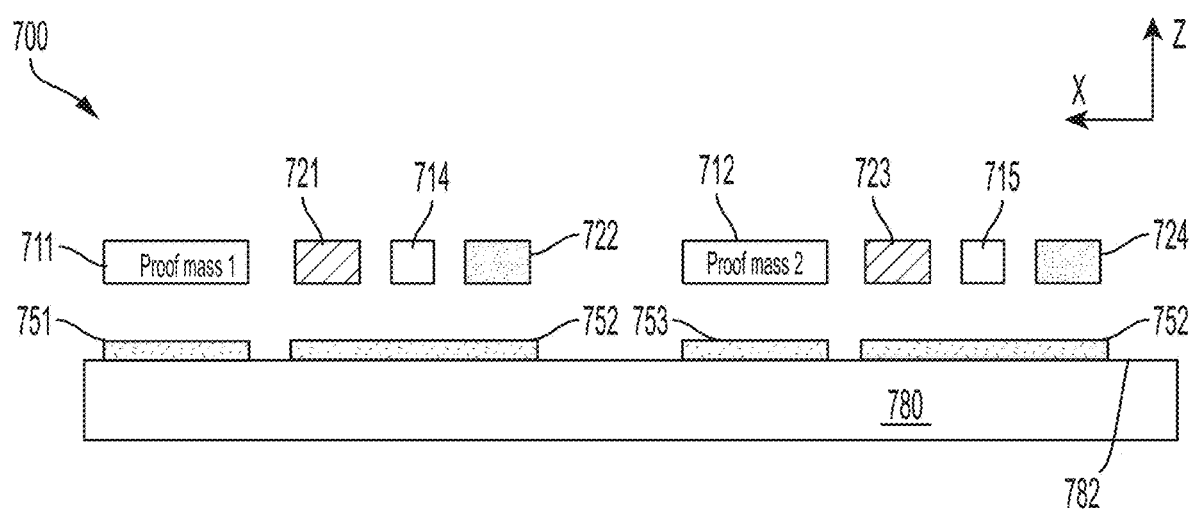
FIG. 7 is a schematic side view diagram of an accelerometer, in accordance with some embodiments.

Another aspect is directed to a split shield disposed on the substrate. FIG. 7 is a schematic side view diagram of an accelerometer, in accordance with some embodiments. FIG. 7 shows two proof masses 711, 712, a first sense finger 721, a second sense finger 722, and a finger 714 that are disposed side-by-side in an XY plane above a surface 782 of substrate 780. Shields 751, 752 and 753 are disposed on surface 782 of the substrate 780. Finger 714 is attached to and moves with proof mass 711. Proof masses 711, 712 are differentially driven with a pair of clock signals of opposite polarity. The X-direction motion of the proof masses are sensed based on capacitance signals at sense fingers 721, 722 which form capacitances with finger 714 that vary in response to X-direction motion of the proof mass 711, as well as capacitance signals at sense fingers 723, 724 which form capacitances with finger 715 that vary in response to X-direction motion of the proof mass 712. Capacitance signals from sense fingers 723, 724 may be used in combination with sense fingers 721, 722 to provide differential sensing of the X-direction motion using any of the methods described above.

Shielding may be provided in between substrate 780 and the proof masses and sense fingers. While a constant voltage may be applied to a shield that extends under both the proof masses and sense fingers, the inventors have recognized and appreciated that such a shield is incompatible with the differential reverse sensing where the proof masses are biased and the sense fingers are used for sending capacitance signals. In particular, because of a large surface area of the proof mass facing substrate 780, each proof mass forms a large capacitive coupling with the substrate. As the proof mass is applied with a time-varying drive signal, even if a constant voltage shielding is provided, the time varying potential difference between the proof mass and the shielding may create crosstalk in sensed electronic signals as well as unwanted mechanical motion of the proof mass. Some embodiments are provided with split shields to solve the different shielding requirements for biased proof masses and the sense fingers.

In the embodiment in FIG. 7, shields 751, 752, 753 are electrically isolated from each other. The shields may be formed of a conductive plate of any suitable size, shape and material, while surface 782 may be an insulative surface of substrate 780. As shown, a first shield 751 is disposed underneath proof mass 711, a second shield 752 is disposed underneath sense electrodes 721, 722, and a third shield 753 is disposed underneath proof mass 712. The first shield 751 covers an area in the XY plane that encompasses substantially the projected area of the suspended proof mass on the XY plane. The second shield 752 covers an area in the XY plane that encompasses substantially the projected area of the suspended sense fingers.

To provide shielding to the biased proof mass 711, the first shield 751 may be coupled to the same drive signal applied to the proof mass 711. Similarly, the third shield 753 may be coupled to the same drive signal applied to the proof mass 712 to provide shielding to proof mass 712. The second shield 752 may be applied with a constant voltage. In one non-limiting example, the drive signals are clock signals alternating between a high and a low voltage potential, and the second shield 752 is kept at a voltage that is the average of the high and low voltage potential in the clock signals.

It should be appreciated that it is not a requirement that all portions of proof mass 711 have the first shield 751 underneath. For example, and as shown in FIG. 7, the finger 714 of proof mass 711 may be outside the first shield 751, while the second shield 752 is underneath finger 714. Because of the relatively small projected area of finger 714 compared to the rest of proof mass 711, capacitive coupling between finger 714 and second shield 752 is small enough as to not to cause significant interference and electrostatic force concerns, while the second shield 752 can provide constant voltage shielding to the sense fingers 721, 722 alike.

Figures 8A, 8B:
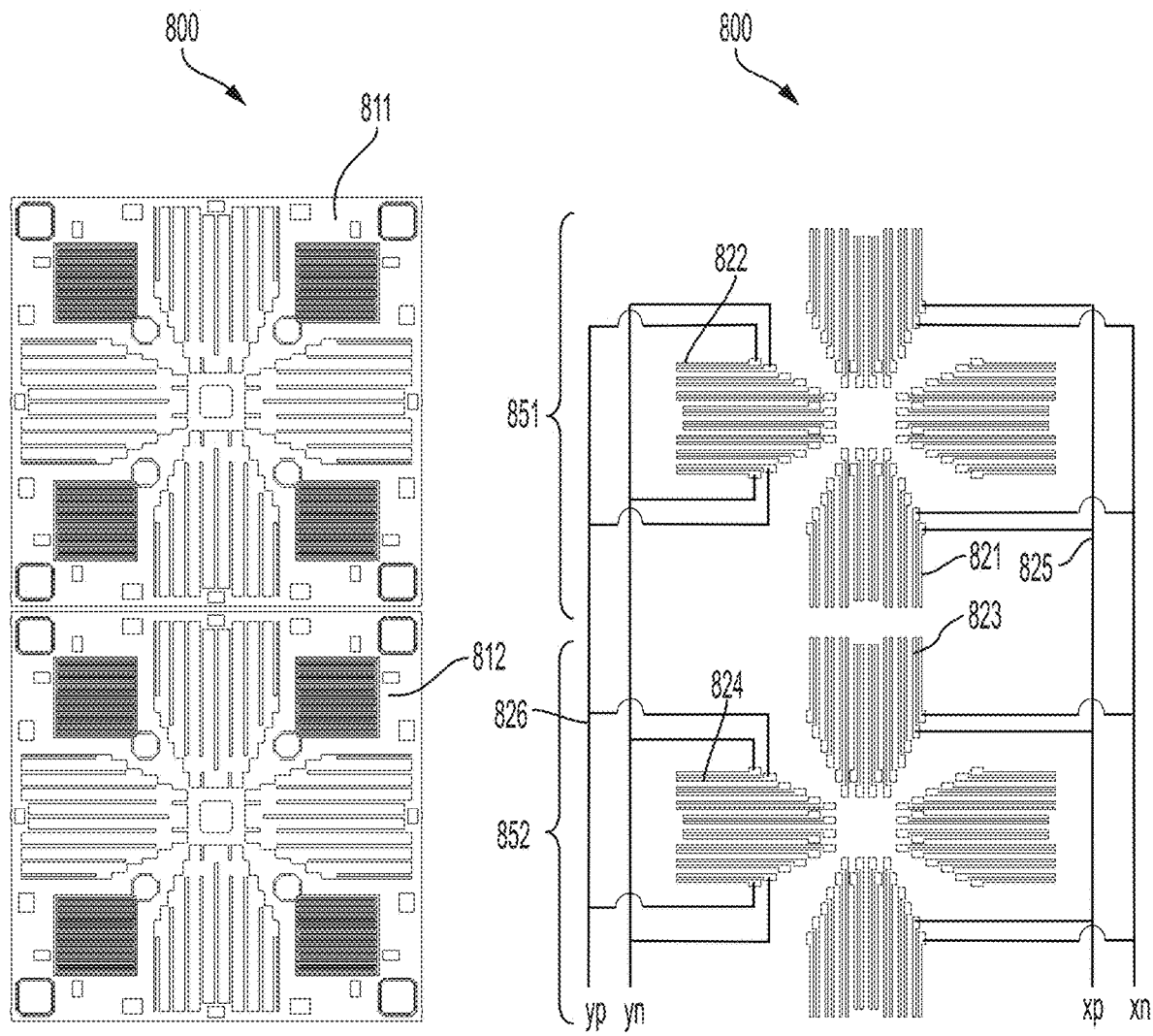
FIGS. 8A and 8B are schematic top view diagrams of a multi-axis MEMS accelerometer with fully differential reverse sensing, in accordance with some embodiments.

FIGS. 8A and 8B are schematic top view diagrams of a multi-axis MEMS accelerometer 800 with fully differential reverse sensing, in accordance with some embodiments. The MEMS accelerometer 800 may be an accelerometer configured to detect acceleration in the XY directions. In FIG. 8A, a first proof mass 811 and a second proof mass 812 are clock nodes that are each applied with a differential clock signal of opposite polarity. FIG. 8B shows the same accelerometer 800, and illustrates a first group of sense fingers 851 capacitively coupled to the first proof mass 811 to sense XY motion of the accelerometer, and a second group of sense fingers 852 capacitively coupled to the second proof mass 812. Within the first group, a subset of X-direction sense fingers 821 are coupled to a subset of X-direction sense fingers 823 of the second group at an X-sensing signal node 825 to provide an X-sensing signal. Within the first group, a subset of Y-direction sense fingers 822 are coupled to a subset of Y-direction sense fingers 824 of the second group at an Y-sensing signal node 826 to provide an Y-sensing signal.

Figure 9A:
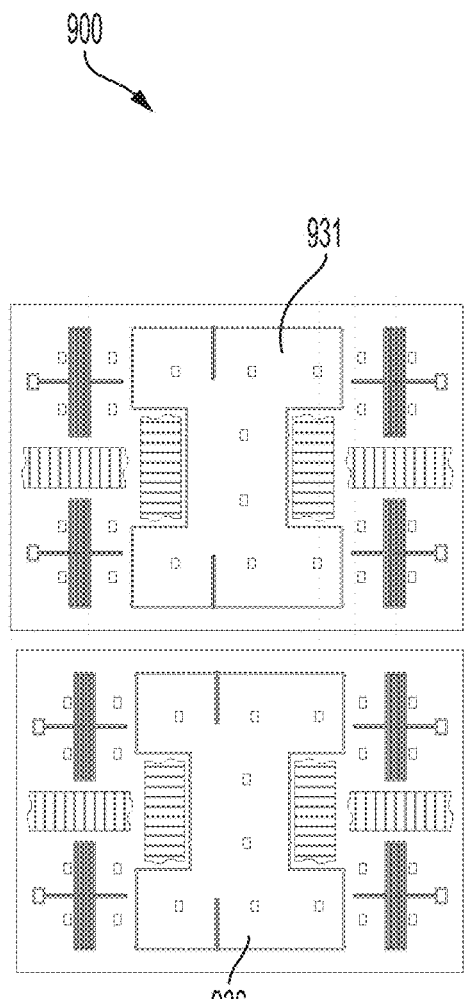
FIGS. 9A and 9B are schematic top view diagrams of a multi-axis MEMS accelerometer with fully differential reverse sensing, in accordance with some embodiments.
Figure 9B:
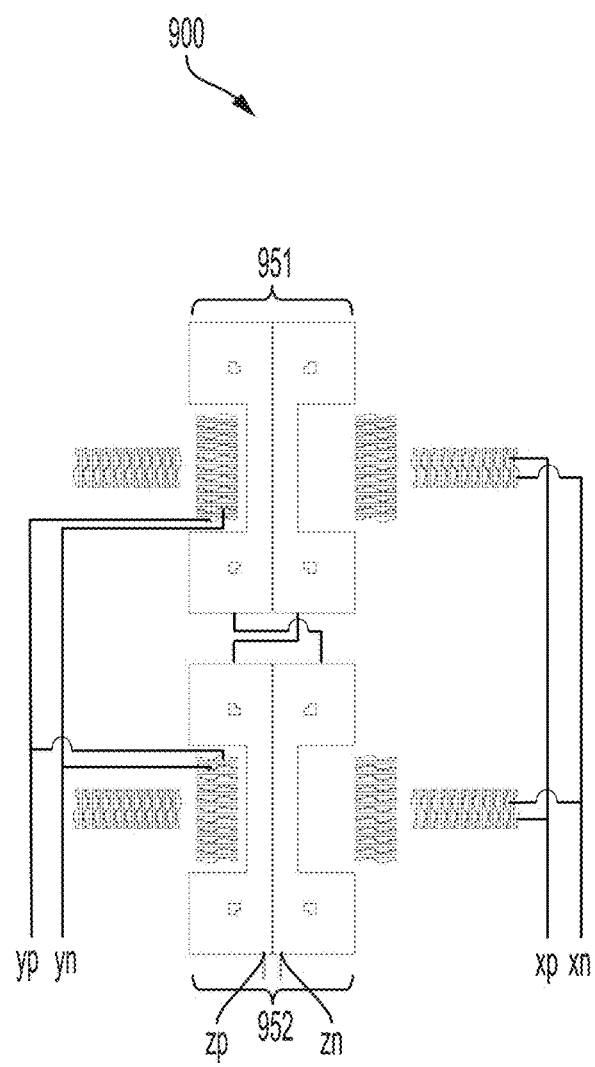

FIGS. 9A and 9B are schematic top view diagrams of a multi-axis MEMS accelerometer 900 with fully differential reverse sensing, in accordance with some embodiments. The MEMS accelerometer 900 may be an accelerometer configured to detect acceleration in the X- Y- and Z-directions, namely a three-axis accelerometer. In FIG. 9A, a first proof mass 931 and a second proof mass 932 are clock nodes that are each applied with a differential clock signal of opposite polarity. FIG. 9B shows the Z-direction sensing nodes of accelerometer 900, with dark regions illustrating a first group of sense fingers 951 capacitively coupled to the first proof mass 931 to sense Z-direction motion of the accelerometer, and a second group of sense fingers 952 capacitively coupled to the second proof mass 932.

In the multi-axis MEMS accelerometer 900 in FIGS. 9A and 9B, first proof mass 931 and second proof mass 932 may be movable along each of the three (X- Y- and Z-) directions, such that differential sensing of accelerations for each of the three axes may be integrated using two proof masses. It should be appreciated that such an integrated multiple-axis sensing is not a requirement, and that in some embodiments, additional proof masses may be provided for Z-direction sensing that are separate from the first and second proof masses for the XY sensing.

Figure 10A:
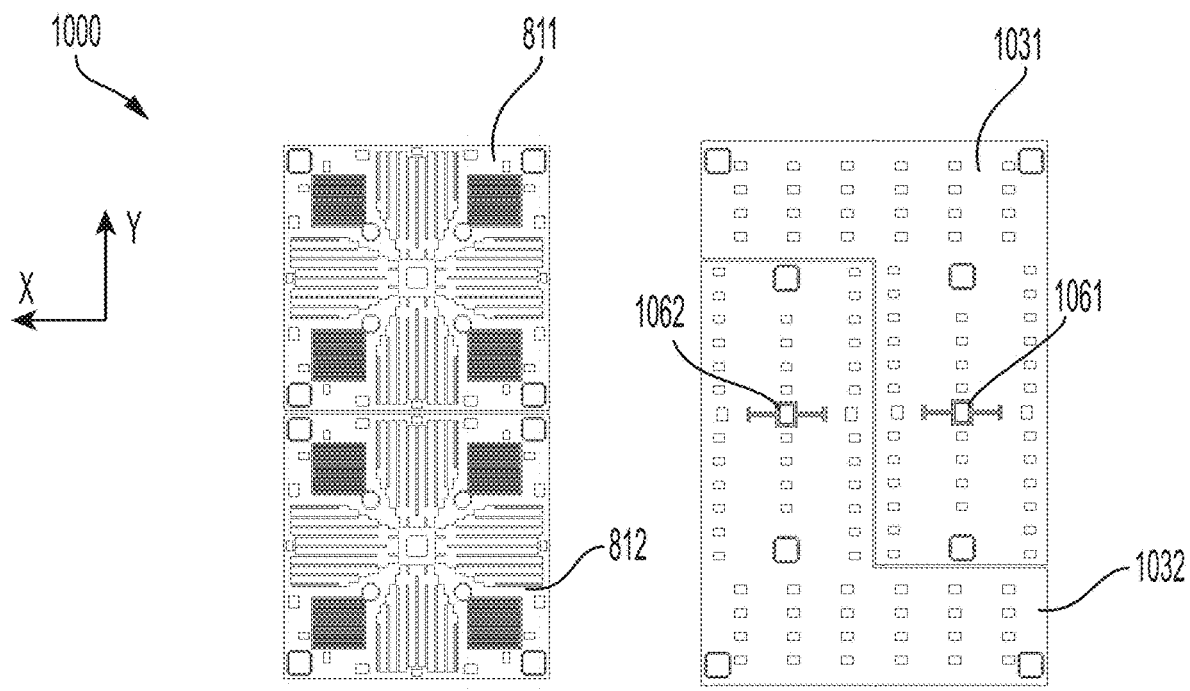
FIGS. 10A and 10B are schematic top view diagrams of a multi-axis MEMS accelerometer 1000 using separate proof masses for fully differential reverse sensing in the Z-axis compared to sensing in the X- and Y-axes, in accordance with some embodiments.
Figure 10B:
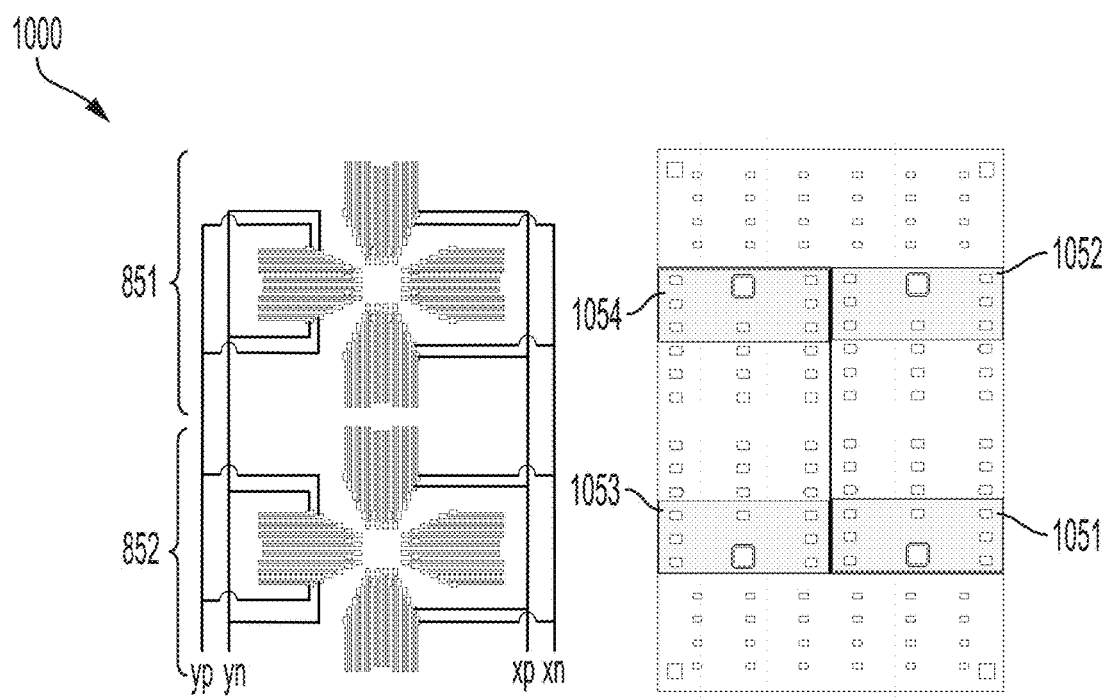

FIGS. 10A and 10B are schematic top view diagrams of a multi-axis MEMS accelerometer 1000 using separate proof masses for fully differential reverse sensing in the Z-axis compared to sensing in the X- and Y-axes, in accordance with some embodiments. The MEMS accelerometer 1000 may be an accelerometer configured to detect acceleration in the X- Y- and Z-directions, namely a three-axis accelerometer. As shown in FIG. 10A, accelerometer 1000 includes a first proof mass 811 and a second proof mass 812 for XY sensing, as discussed above in relation to FIG. 8A. Accelerometer 1000 further includes a third proof mass 1031 and a fourth proof mass 1032 for Z-direction sensing. To provide for fully differential sensing, the third and fourth proof masses 1031, 1032 in FIG. 10A are clock nodes that are each applied with a differential clock signal of opposite polarity.

FIG. 10B shows the sensing nodes of accelerometer 1000. For XY sensing, accelerometer 1000 includes a first group of sense fingers 851 and a second group of sense fingers 852, as discussed above in relation to FIG. 8B. For Z sensing, accelerometer 1000 includes electrodes 1051, 1052 that are capacitively coupled to the third proof mass 1061, and electrodes 1053, 1054 that are capacitively coupled to the fourth proof mass 1062.

Figure 11:
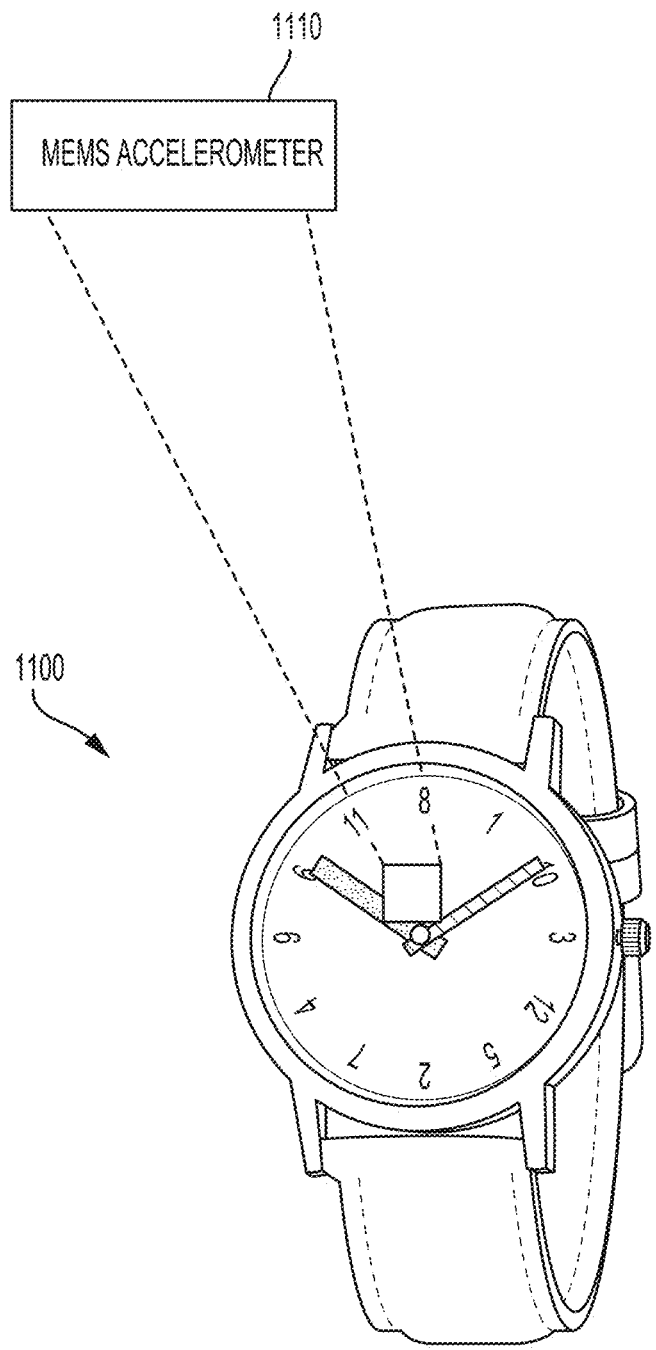
FIG. 11 is a schematic diagram of an electronic device that houses one or more MEMS accelerometers.

FIG. 11 is a schematic diagram of an electronic device 1100 that houses one or more MEMS accelerometers 1110. According to an aspect of the present application, MEMS accelerometer 1110 may be provided in consumer electronic devices such as the wearable electronic device 1100 as shown in FIG. 11 to measure acceleration of the sensor device. In one example, wearable electronic device 1100 is a smart wristwatch that measures a user's arm/hand movement. In another example, electronic device 1100 may be a linear or rotational accelerometer or a gyroscopic inertial sensor used in a vehicle to track motion of the vehicle based on the MEMS accelerometer 1110. Other uses are possible.

Various aspects of the technology may be used alone, in combination, or in a variety of arrangements not specifically discussed in the embodiments described in the foregoing and is therefore not limited in its application to the details and arrangement of components set forth in the foregoing description or illustrated in the drawings. For example, while in some examples two proof masses are illustrated, it should be appreciated that an accelerometer may comprise more than two proof masses. Aspects described in one embodiment may be combined in any manner with aspects described in other embodiments.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

What is claimed is:

1. A differential, multiple-mass, multi-axis accelerometer, comprising:
    first and second proof masses arranged in a substrate side-by-side and in-plane with each other, movable along in-plane X and Y-directions, and configured to have applied thereto a differential drive signal including a first polarity signal applied to the first proof mass and a second polarity signal applied to the second proof mass;
    a first plurality of sense fingers coupled to the substrate, capacitively coupled with the first and second proof masses, and configured to sense X-direction movement of the first and second proof masses;
    a second plurality of sense fingers coupled to the substrate, capacitively coupled with the first and second proof masses, and configured to sense Y-direction movement of the first and second proof masses;
    a first shield disposed on the substrate underneath the first proof mass; and
    a second shield electrically isolated from the first shield and disposed on the substrate underneath at least some of the first plurality of sense fingers,
    wherein the first plurality of sense fingers are configured in combination to output a differential X-direction motion signal, and
    wherein the second plurality of sense fingers are configured in combination to output a differential Y-direction motion signal.

2. The differential, multiple-mass, multi-axis accelerometer of claim 1, wherein the first proof mass and the first shield are electrically coupled to a same bias voltage node.

3. The differential, multiple-mass, multi-axis accelerometer of claim 2, wherein the second shield is electrically coupled to a constant voltage node.

4. The differential, multiple-mass, multi-axis accelerometer of claim 1, wherein each of the first and second proof masses is movable along a Z-direction, and the accelerometer further comprises:
a third plurality of sense electrodes coupled to the substrate, capacitively coupled with the first and second proof masses, and configured to sense Z-direction movement of the first and second proof masses,
wherein the third plurality of sense electrodes are configured in combination to output a differential Z-direction motion signal.

5. The differential, multiple-mass, multi-axis accelerometer of claim 1, wherein a first subset of the first plurality of sense fingers forms a variable capacitance with the first proof mass that increases as the first proof mass moves in a positive X-direction, a second subset of the first plurality of sense fingers forms a variable capacitance with the second proof mass that decreases as the second proof mass moves in the positive X-direction, and wherein the differential, multiple-mass, multi-axis accelerometer further comprises an X-sensing signal node disposed on the substrate and configured to combine a first X-sensing signal from the first subset of the first plurality of sense fingers with a second X-sensing signal from the second subset of the first plurality of sense fingers.

6. The differential, multiple-mass, multi-axis accelerometer of claim 5, further comprising:
one or more differential amplifiers coupled to the X-sensing signal node and configured to amplify the differential X-direction motion signal.

7. The differential, multiple-mass, multi-axis accelerometer of claim 1, wherein:
the first plurality of sense fingers and the second plurality of sense fingers are fixedly coupled to the substrate.

8. The differential, multiple-mass, multi-axis accelerometer of claim 1, further comprising:
a third movable mass and a fourth movable mass disposed side-by-side in the substrate and each movable along a Z-direction; and
a third plurality of sense electrodes coupled to the substrate, capacitively coupled with the third and fourth proof masses, and configured to sense Z-direction movement of the third and fourth proof masses, wherein the third plurality of sense electrodes are configured in combination to output a differential Z-direction motion signal.

9. A multi-axis differential accelerometer, comprising:
a first movable mass and a second movable mass disposed side-by-side in a substrate and each movable along an X-direction and a Y-direction;
a first group of electrodes capacitively coupled with the first movable mass;
a second group of electrodes capacitively coupled with the second movable mass;
an X-sensing signal node disposed on the substrate and coupled to a first subset of the first group of electrodes and a first subset of the second group of electrodes, the X-sensing signal node configured to provide an X-sensing signal indicative of motion of the accelerometer in the X-direction when the first movable mass and the second movable mass are differentially biased; and
a Y-sensing signal node disposed on the substrate and coupled to a second subset of the first group of electrodes and a second subset of the second group of electrodes, the Y-sensing signal node configured to provide a Y-sensing signal indicative of motion of the accelerometer in the Y-direction when the first movable mass and the second movable mass are differentially biased.

10. The multi-axis differential accelerometer of claim 9, wherein a projected area of the first movable mass in an XY plane is larger than a projected area of the first group of electrodes in the XY plane.

11. The multi-axis differential accelerometer of claim 9, further comprising:
one or more differential amplifiers coupled to the X-sensing signal node and Y-sensing signal node, and configured to amplify the X-sensing signal and Y-sensing signal.

12. The multi-axis differential accelerometer of claim 9, further comprising:
a first shield disposed on the substrate underneath the first movable mass;
a second shield electrically isolated from the first shield and disposed on the substrate underneath at least some of the first group of electrodes.

13. The multi-axis differential accelerometer of claim 12, wherein the first movable mass and the first shield are electrically coupled to a same bias voltage node.

14. The multi-axis differential accelerometer of claim 13, wherein the second shield is electrically coupled to a constant voltage node.

15. The multi-axis differential accelerometer of claim 9, wherein each of the first and second movable masses is movable along a Z-direction, and the accelerometer further comprises:
a Z-sensing signal node disposed on the substrate and coupled to a third subset of the first group of electrodes and a third subset of the second group of electrodes, the Z-sensing signal node configured to generate a Z-sensing signal indicative of motion of the accelerometer in the Z-direction when the first movable mass and the second movable mass are differentially biased.

16. The multi-axis differential accelerometer of claim 9, wherein
the first subset of the first group of electrodes forms a capacitance with the first movable mass that increases as the first movable mass moves in a positive X-direction; and
the first subset of the second group of electrodes forms a capacitance with the second movable mass that decreases as the second movable mass moves in the positive X-direction.

17. The multi-axis differential accelerometer of claim 16, wherein the X-sensing signal node is a first X-sensing signal node, the X-sensing signal is a first X-sensing signal, and the accelerometer further comprises:
a second X-sensing signal node disposed on the substrate and coupled to a fourth subset of the first group of electrodes and a fourth subset of the second group of electrodes, the second X-sensing signal node configured to provide a second X-sensing signal when the first movable mass and the second movable mass are differentially biased,
wherein the fourth subset of the first group of electrodes forms a capacitance with the first movable mass that decreases as the first movable mass moves in the positive X-direction, the fourth subset of the second group of electrodes forms a capacitance with the second movable mass that increases as the second movable mass moves in the positive X-direction; and a differential amplifier having inputs coupled to the first and second X-sensing signal nodes, respectively, and configured to generate an output signal indicative of an acceleration of the accelerometer in the X-direction based on the first and second X-sensing signals.

18. The multi-axis differential accelerometer of claim 9, wherein:

the first group of electrodes and the second group of electrodes are fixed to the substrate.

19. The multi-axis differential accelerometer of claim 9, wherein the first movable mass and the second movable mass are mechanically coupled through a linkage, and are electrically isolated from each other across the linkage.

20. A method for measuring multi-axis acceleration with a multiple-mass, differential accelerometer comprising first and second proof masses arranged in a substrate side-by-side, the method comprising:

biasing the first and second proof masses with a differential drive signal;

combining, at an X-sensing signal node disposed on the substrate, a first capacitance signal from a first plurality of sense fingers capacitively coupled with the first proof mass with a second capacitance signal from a second plurality of sense fingers capacitively coupled with the second proof mass;

combining, at a Y-sensing signal node disposed on the substrate, a third capacitance signal from a third plurality of sense fingers capacitively coupled with the first proof mass with a fourth capacitance signal from a second plurality of sense fingers capacitively coupled with the second proof mass;

outputting a differential X-direction motion signal based on a signal at the X-sensing signal node; and outputting a differential Y-direction motion signal based on a signal at the Y-sensing signal node.

21. The method of claim 20, further comprising:

biasing a first shield and the first proof mass with a same drive signal, wherein the first shield is disposed on the substrate underneath the first proof mass.

22. The method of claim 21, further comprising:

biasing a second shield with a constant voltage, wherein the second shield is electrically isolated from the first shield and is disposed on the substrate underneath at least some of the first plurality of sense fingers and the third plurality of sense fingers.

23. The method of claim 20, further comprising:

combining, at a Z-sensing signal node disposed on the substrate, a fifth capacitance signal from a fifth plurality of sense electrodes capacitively coupled with the first proof mass with a sixth capacitance signal from a sixth plurality of sense electrodes capacitively coupled with the second proof mass; and outputting a differential Z-direction motion signal based on a signal at the Z-sensing signal node.

24. The method of claim 20, wherein the first capacitance signal increases as the first proof mass moves in a positive X-direction, and the second capacitance signal decreases as the second proof mass moves in the positive X-direction.

* * * * *